United States Patent
Charlebois et al.

(10) Patent No.: US 9,097,765 B1
(45) Date of Patent: Aug. 4, 2015

(54) PERFORMANCE SCREEN RING OSCILLATOR FORMED FROM MULTI-DIMENSIONAL PAIRINGS OF SCAN CHAINS

(71) Applicant: International Business Machines Corporation, Armonk, NY (US)

(72) Inventors: Margaret R. Charlebois, Jericho, VT (US); Christopher D. Hanudel, Essex Junction, VT (US); Robert D. Herzl, South Burlington, VT (US); David W. Milton, Underhill, VT (US); Clarence R. Ogilvie, Huntington, VT (US); Paul M. Schanely, Essex Junction, VT (US); Tad J. Wilder, South Hero, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/273,247

(22) Filed: May 8, 2014

(51) Int. Cl.
*G01R 31/3185* (2006.01)
*G01R 31/3177* (2006.01)
*G01R 31/28* (2006.01)
*G06F 11/267* (2006.01)
*G01R 31/3187* (2006.01)
*G06F 11/14* (2006.01)

(52) U.S. Cl.
CPC .... *G01R 31/318541* (2013.01); *G01R 31/2815* (2013.01); *G01R 31/3177* (2013.01); *G06F 11/267* (2013.01); *G01R 31/3187* (2013.01); *G01R 31/318533* (2013.01); *G06F 11/1423* (2013.01)

(58) Field of Classification Search
CPC ... G06F 11/1423; G06F 11/267; G06F 11/27; G01R 31/2815; G01R 31/3177; G01R 31/318533; G01R 31/318536; G01R 31/318541; G01R 31/3187
USPC .......................................... 714/726, 727, 729
See application file for complete search history.

(56) References Cited

U.S. PATENT DOCUMENTS

| 3,665,396 A | 5/1972 | Forney, Jr. |
| 5,592,493 A | 1/1997 | Crouch et al. |

(Continued)

FOREIGN PATENT DOCUMENTS

JP 2005003917 A 1/2005

OTHER PUBLICATIONS

Cheng Jin; Ni Wang; Xiaowen Xu; Houjun Sun, "Built-in-self-test 3-D ring oscillator for stacked 3DIC," Radio-Frequency Integration Technology (RFIT), 2014 IEEE International Symposium on , vol., no., pp. 1,3, Aug. 27-30, 2014.*

(Continued)

*Primary Examiner* — Cynthia Britt
(74) *Attorney, Agent, or Firm* — Anthony J. Canale; Hoffman Warnick LLC (57) ABSTRACT

A performance screen ring oscillator (PSRO) is formed from multi-dimensional pairings of scan chains. In one embodiment, there is a multi-dimensional arrangement of scan chains in an integrated circuit. Each of the scan chains has interconnected scan chain elements that form a shift register to apply test patterns to inputs of combinational logic in the integrated circuit and read outputs from the combinational logic based on the inputted test patterns. A scan chain link links selected scan chain elements from the scan chains to form at least one PSRO loop within the multi-dimensional arrangement of the scan chains.

20 Claims, 9 Drawing Sheets

(56) References Cited

U.S. PATENT DOCUMENTS

| | | | |
|---|---|---|---|
| 5,689,517 A | | 11/1997 | Ruparel |
| 6,158,032 A | * | 12/2000 | Currier et al. ................. 714/726 |
| 6,219,813 B1 | | 4/2001 | Bishop et al. |
| 6,388,533 B2 | | 5/2002 | Swoboda |
| 6,535,013 B2 | | 3/2003 | Samaan |
| 6,867,613 B1 | | 3/2005 | Bienek |
| 7,208,934 B2 | | 4/2007 | King et al. |
| 7,349,271 B2 | | 3/2008 | Kuang et al. |
| 7,539,893 B1 | | 5/2009 | Ferguson |
| 7,550,987 B2 | | 6/2009 | Acharyya et al. |
| 7,609,542 B2 | | 10/2009 | Adams et al. |
| 7,620,510 B2 | | 11/2009 | Carpenter et al. |
| 7,835,176 B2 | | 11/2010 | Adams et al. |
| 7,958,417 B2 | | 6/2011 | Chakraborty et al. |
| 8,154,309 B2 | | 4/2012 | Agarwal et al. |
| 8,214,699 B2 | | 7/2012 | Arsovski et al. |
| 2002/0129293 A1 | | 9/2002 | Hutton et al. |
| 2002/0199145 A1 | | 12/2002 | Komoike |
| 2004/0098646 A1 | | 5/2004 | Fisher |
| 2004/0190331 A1 | | 9/2004 | Ross et al. |
| 2005/0028060 A1 | | 2/2005 | Dervisoglu et al. |
| 2006/0269038 A1 | | 11/2006 | Jang et al. |
| 2007/0089078 A1 | | 4/2007 | Engel et al. |
| 2007/0237012 A1 | | 10/2007 | Kuang et al. |
| 2008/0034337 A1 | | 2/2008 | Kuemerle et al. |
| 2008/0195337 A1 | | 8/2008 | Agarwal et al. |
| 2009/0113263 A1 | | 4/2009 | Cannon et al. |
| 2009/0210760 A1 | | 8/2009 | Eckelman et al. |
| 2009/0295402 A1 | | 12/2009 | Balch et al. |
| 2010/0042962 A1 | | 2/2010 | Fazekas et al. |
| 2010/0107024 A1 | | 4/2010 | Tokunaga |
| 2010/0188888 A1 | | 7/2010 | Adams et al. |
| 2010/0201418 A1 | | 8/2010 | Delage et al. |
| 2010/0264932 A1 | | 10/2010 | Marinissen et al. |
| 2010/0321042 A1 | | 12/2010 | Agarwal et al. |
| 2012/0233512 A1 | | 9/2012 | Huang et al. |
| 2013/0125073 A1 | | 5/2013 | Bickford et al. |
| 2013/0179742 A1 | | 7/2013 | Tekumalla |
| 2013/0285739 A1 | * | 10/2013 | Blaquiere et al. ............. 327/565 |
| 2014/0132290 A1 | | 5/2014 | Charlebois et al. |
| 2014/0298128 A1 | | 10/2014 | Maliuk et al. |
| 2015/0032962 A1 | * | 1/2015 | Buyuktosunoglu et al. .. 711/122 |

OTHER PUBLICATIONS

Hawkins, Final Office Action Communication for U.S. Appl. No. 13/676,063 dated Oct. 24, 2014, 20 pages.

U.S. Appl. No. 14/273,261, Office Action 1 dated Apr. 23, 2015, 21 pgs.

Bickfor, J.P,; Jinjun Xiong, "Use of performance path test to optimize yield," Advanced Semiconductor Manufacturing Conference (ASMC), 2013 24th Annual SEMI, vol. No. pp. 206, 211, May 14-16, 2013.

Gabor et al., Improving the Power-Performance of Multicore Processors Through Optimization of Lithography and Thermal Processing, Oct. 13, 2010, Improved power-performance metrics, 7 pages.

IBM, "PSRO Yield and Model to Hardware Correlation Improvement for ASIC Arrays," Nov. 2008, 5 pages, IPCOM000176339D, An IP.com Prior Art Database Technical Disclosure.

Hawkins, Office Action Communication for U.S. Appl. No. 13/676,063 dated Sep. 3, 2014, 26 pages.

U.S. Appl. No. 13/676,063, Office Action 2 dated Feb. 18, 2015, 27 pgs.

U.S. Appl. No. 14/273,261, Notice of Allowance dated May 4, 2015, 6 pgs.

* cited by examiner

PERFORMANCE SCREEN RING OSCILLATOR FORMED FROM MULTI-DIMENSIONAL PAIRINGS OF SCAN CHAINS

CROSS REFERENCE TO RELATED APPLICATIONS

This patent application relates to commonly-assigned U.S. patent application Ser. No. 14/273,261 entitled "PERFORMANCE SCREEN RING OSCILLATOR FORMED FROM PAIRED SCAN CHAINS", filed concurrently with this application.

BACKGROUND

The disclosure of this application relates generally to scan chains, and more particularly, to a performance screen ring oscillator (PSRO) formed from multi-dimensional pairings of scan chains.

As the size of integrated circuits decrease, across chip variation (ACV) is becoming an increasing concern. A transistor on one side of an integrated circuit will not always operate similar to a transistor on another side of the integrated circuit. Margins are provided in order to ensure that the integrated circuit operates as desired, however, this can lead to reduced performance and increased power requirements.

It is helpful to understand how an integrated circuit will behave, in order to minimize these margins. Performance screen ring oscillators (PSROs) can be used to monitor and predict performance in areas of an integrated circuit. A PSRO is usually used in close proximity to the area that is being monitored. Typically, a large number of PSROs are needed in order to monitor many areas of an integrated circuit. However, current PSROs can take up significant space and wiring, which may make them less appealing for use in monitoring and predicting performance of areas in an integrated circuit.

SUMMARY

In one embodiment, there is a circuit structure comprising: a multi-dimensional arrangement of a plurality of scan chains in an integrated circuit, each of the scan chains having a plurality of interconnected scan chain elements that form a shift register to apply test patterns to inputs of combinational logic in the integrated circuit and read outputs from the combinational logic based on the inputted test patterns; and a scan chain link that links selected scan chain elements from the scan chains to form at least one performance screen ring oscillator (PSRO) loop within the multi-dimensional arrangement of the scan chains.

In another embodiment, there is a circuit structure, comprising: a two-dimensional grid structure of a plurality of scan chains arranged in rows and columns in an integrated circuit, each of the scan chains having a plurality of interconnected scan chain elements that form a shift register to apply test patterns to inputs of combinational logic in the integrated circuit and read outputs from the combinational logic based on the inputted test patterns, wherein adjacent scan chains in the rows and columns have a direction of data flow that is opposite from one another; and a scan chain link that links selected scan chain elements from the scan chains to form at least one performance screen ring oscillator (PSRO) loop within the two-dimensional grid structure of scan chains, the PSRO loop forming a pattern in the rows and columns of the two-dimensional grid structure, wherein a flow direction of the PSRO loop follows the direction of data flow of the scan chains in the rows and columns of the two-dimensional grid structure in which the PSRO loop is situated.

In still another embodiment, there is a method comprising: configuring a multi-dimensional arrangement of a plurality of scan chains in an integrated circuit, each of the scan chains having a plurality of interconnected scan chain elements that form a shift register to apply test patterns to inputs of combinational logic in the integrated circuit and read outputs from the combinational logic based on the inputted test patterns; and forming at least one performance screen ring oscillator (PSRO) loop within the multi-dimensional arrangement of the scan chains.

DETAILED DESCRIPTION

Figure 1:
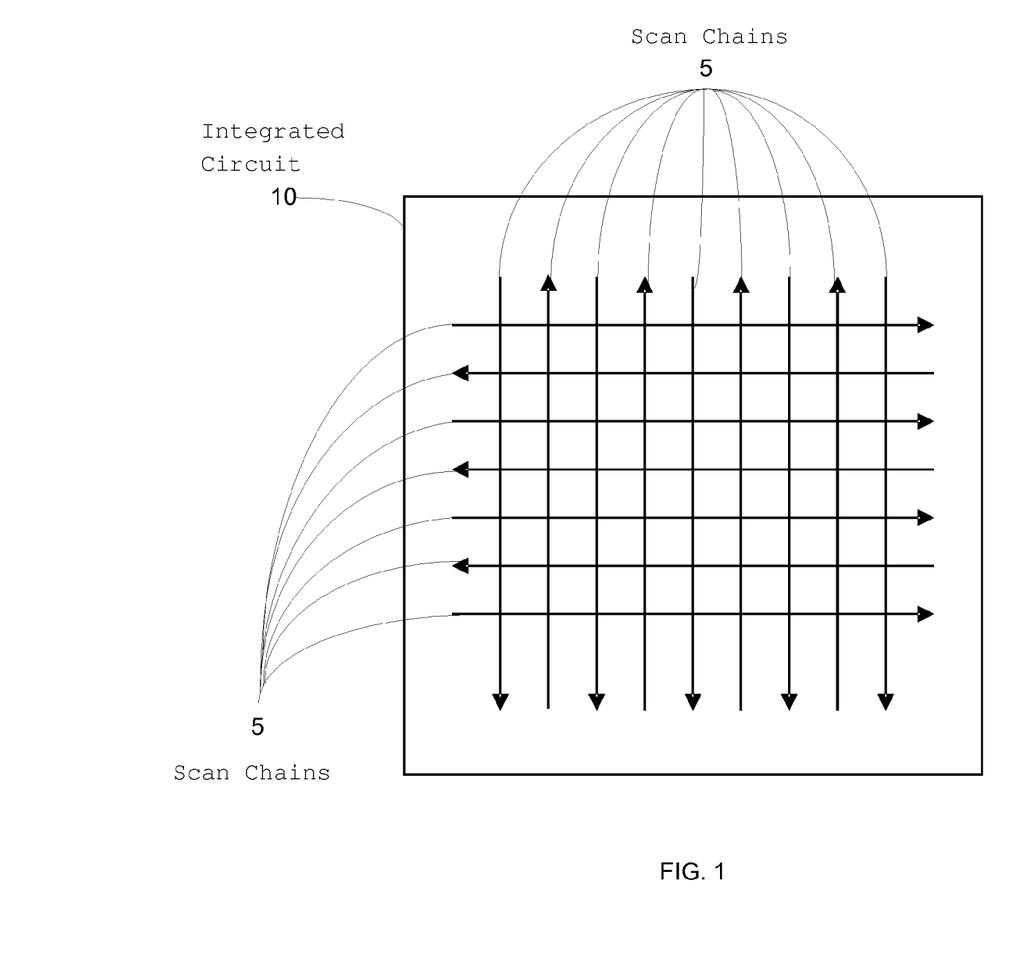
FIG. 1 is a schematic diagram illustrating a multi-dimensional arrangement of scan chains in an integrated circuit that can be used to form performance screen ring oscillator (PSRO) loops according to an embodiment of the invention.

Referring now to the drawings, FIG. 1 is a schematic diagram illustrating a multi-dimensional arrangement of scan chains 5 in an integrated circuit 10 that can be used to form performance screen ring oscillator (PSRO) loops according to an embodiment of the invention. Although not shown in FIG. 1, each scan chain 5 can have multiple scan chain elements or cells that can be implemented by, for example, flip flops or latches. The scan chain elements in each scan chain 5 can be configured to form a shift register for applying test patterns to inputs of combinational logic in integrated circuit 10 and reading outputs from the combinational logic based on the inputted test patterns. In a test mode, which includes scan and functional clocking, the scan chain elements can be used to apply test patterns and read test results. During a functional mode, the scan operation is disabled (i.e., the scan chain elements do not apply and read the test patterns), enabling the combinational logic in integrated circuit 10 to operate in their intended manner.

For clarity, integrated circuit 10 is not illustrated with combinational logic. Those skilled in the art will appreciate that integrated circuit 10 would include circuitry that embodies the combinational logic as well as scan test circuitry that includes scan chains 5 and scan chain links that can pair scan chain elements of the scan chains to form PSRO loops in a multi-dimensional arrangement of the scan chains.

Figure 2:
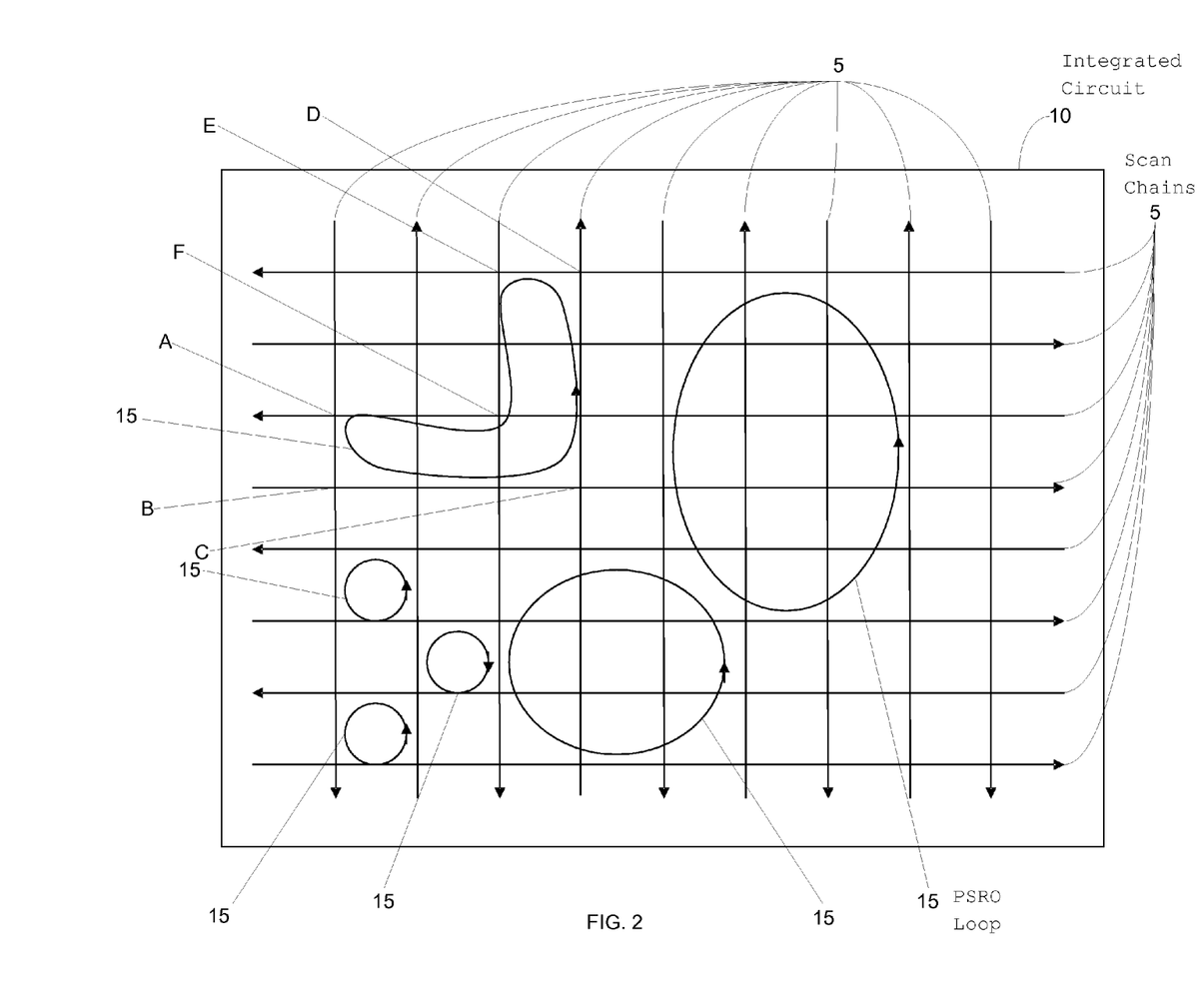
FIG. 2 is a schematic diagram illustrating examples of PSRO loops that can be formed in a two-dimensional grid structure such as one depicted in FIG. 1 according to an embodiment of the invention.
Figure 5:
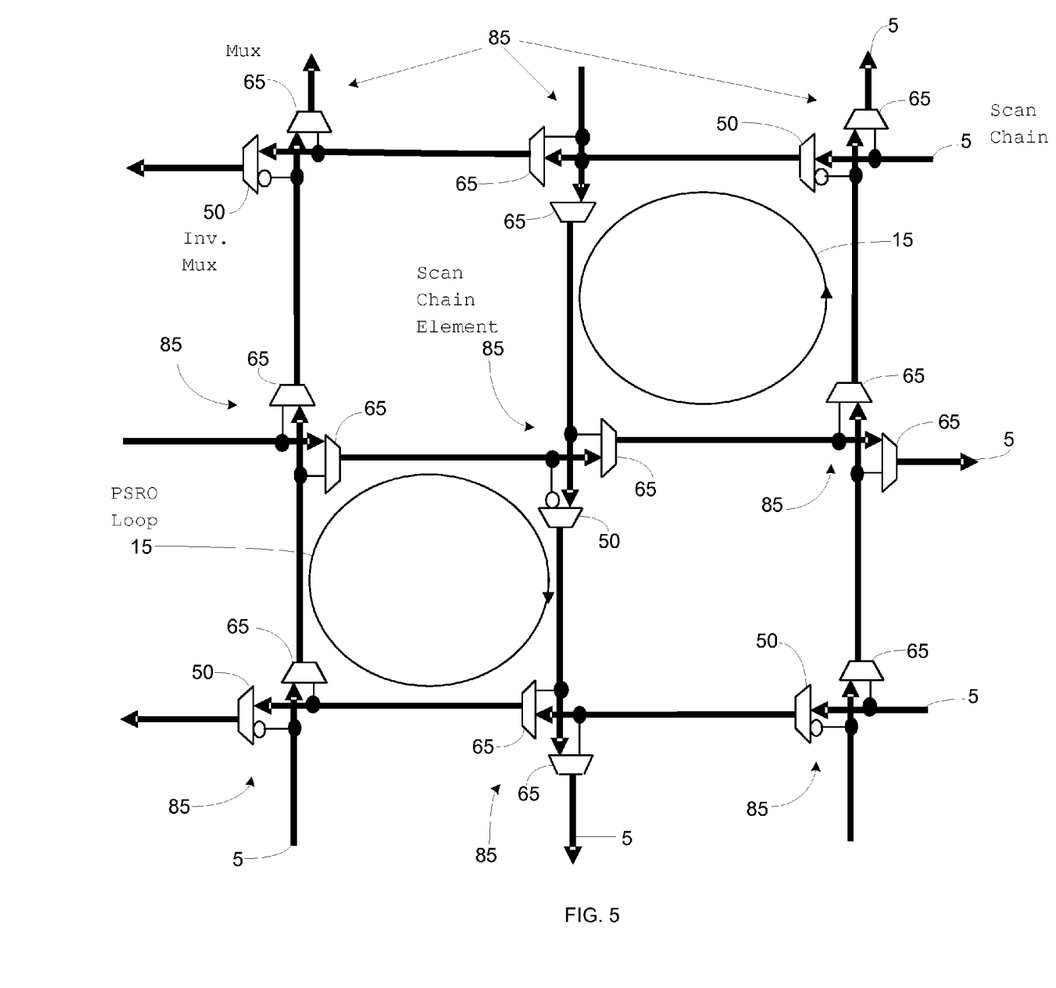
FIG. 5 is a schematic diagram showing details of scan chain elements at a particular location in FIG. 1 where the scan chains intersect according to an embodiment of the invention.

In one embodiment, as shown in FIG. 1, as well as FIGS. 2 and 5, the multi-dimensional arrangement of scan chains 5 can take the form of a two-dimensional grid structure, where the scan chains are arranged in rows and columns in integrated circuit 10. The direction that data flows through scan chains 5 is denoted in FIG. 1 by a directional arrow located at one end of the scan chain. As shown in FIG. 1 adjacent scan chains in each of the rows and columns can have a direction of data flow that is opposite from one another. This alternating direction of data flow between scan chains in adjacent rows and columns is only one example of a grid structure that can be used to generate PSRO loops. Those skilled in the art will appreciate that other types of patterns are suitable for generating PSRO loops. For example, the direction of data flow between scan chains 5 in adjacent rows and columns of scan chains having a common direction can be arranged in an even or an odd numbered pattern per row and column. In another embodiment, the direction of data flow between scan chains in adjacent rows and columns can be arranged in a non-contiguous pattern.

Furthermore, although the various embodiments of the present invention are described primarily with respect to forming PSRO loops in a two-dimensional grid structure of scan chains, those skilled in the art will appreciate that the PSRO loops can be formed in other multi-dimensional arrangements. For example, the PSRO loops can be formed in other types of two-dimensional grid structures such as, for example, diagonals, chains, circular/spine patterns, Zig-zag patterns, or any case where scan chains proximate to each other have a data direction opposite to each other, even if only partially implemented using pairing of short segments of scan chains. In addition, the various embodiments of the present invention are applicable to a three-dimensional arrangement of the scan chains.

In addition, the use of a multi-dimensional arrangement of scan chains to form PSRO loops is not limited solely to physical dimensions in which the scan chains are arranged with respect to each other. Instead, the use of a multi-dimensional arrangement of scan chains to form PSRO loops can be based on a predetermined pairing parameter that is common to the scan chains. The predetermined pairing parameter can be used to form any grouping of latches from the scan chains that are co-located despite each having different unique characteristics. For example, the predetermined pairing parameter can include, but is not limited to, voltage threshold families that are specific to certain scan chains, power supplies that are used to provide power to certain scan chain elements, and functional clocks that are used to drive signals applied to certain scan chains.

Referring back to the drawings, FIG. 2 is a schematic diagram illustrating examples of PSRO loops 15 that can be formed in a two-dimensional grid structure such as the one depicted in FIG. 1. As explained below in more detail, a scan chain link can link selected scan chain elements from scan chains 5 to form at least one PSRO loop 15 within the two-dimensional grid structure of scan chains. In this manner, each PSRO loop 15 can form a pattern in the rows and columns of the two-dimensional grid structure. In one embodiment, a directional flow of each PSRO loop 15 follows the direction of data flow of the scan chains in the rows and columns of the two-dimensional grid structure in which the PSRO loop is situated, as indicated by the directional arrow associated with each PSRO loop 15.

For example, consider the PSRO loop 15 in the top left-hand corner of the grid structure in FIG. 2. Starting from the top left of this PSRO loop 15 at point A, the loop extends down the column in the direction associated with that scan chain, turns left at point B (taken from direction of scan chain) at the next row, traverses three columns following the direction of the scan chain in that row, turns left at the third column at Point C, traverses three rows up the scan chain of that column, turns left at Point D, traverses one row, turns left at Point E, traverses two rows of the scan chain down the column following the direction of that column, turns right at Point F at that scan chain, connecting back to Point A to complete this PSRO loop 15.

Figure 3A:
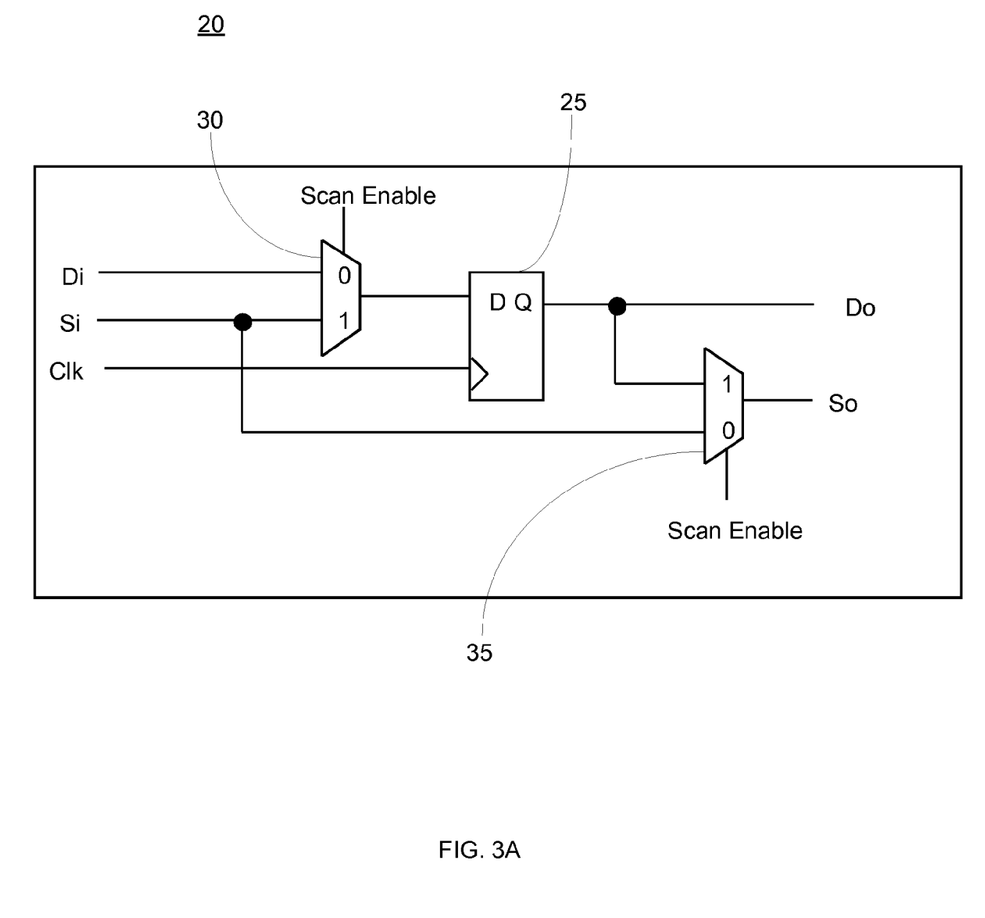
FIGS. 3A-3C are schematic diagrams showing details of scan chain elements that can be used at various locations along the scan chains depicted in FIGS. 1-2 according to an embodiment of the invention.
Figure 3B:
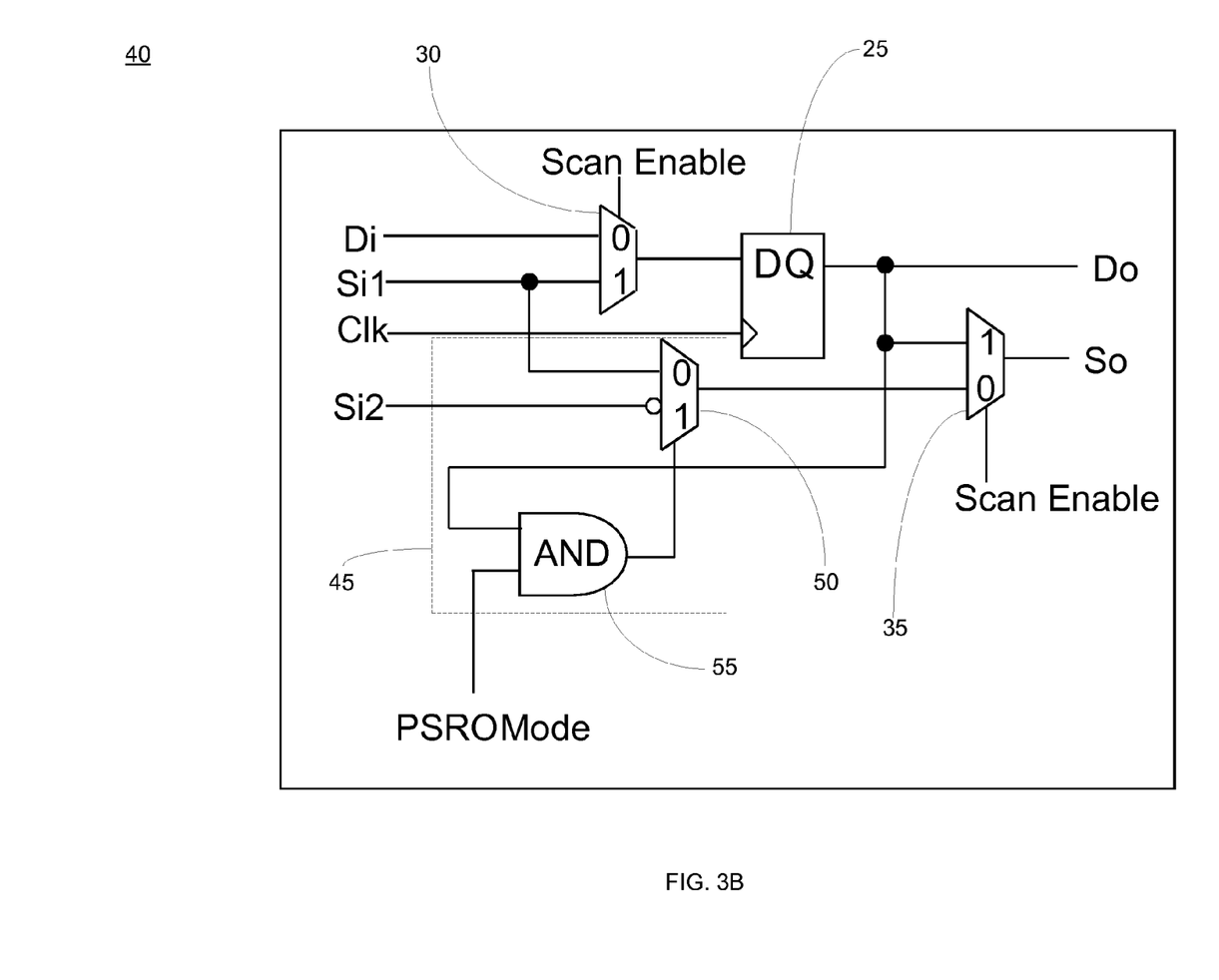
Figure 3C:
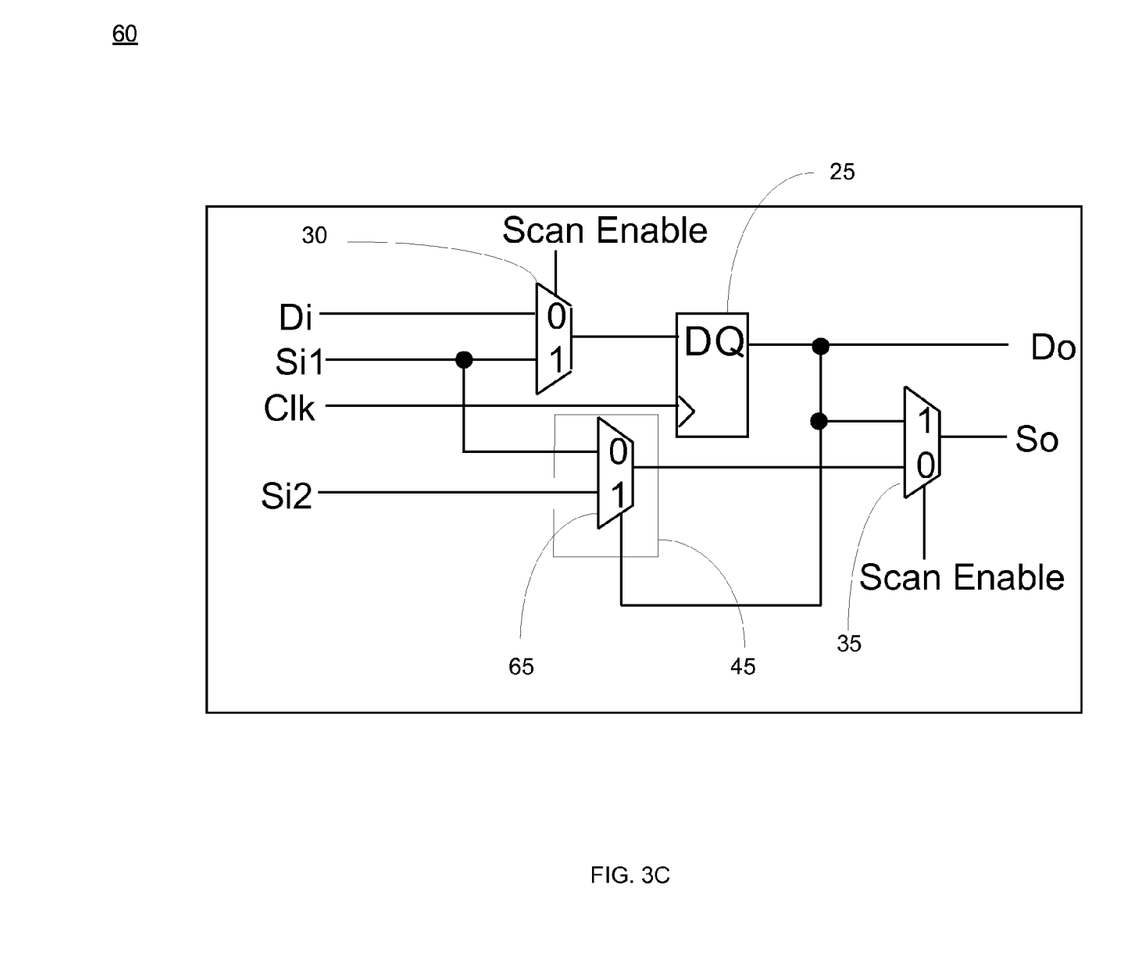

FIGS. 3A-3C is a schematic diagram showing further details of the scan chain elements that can be used at various locations along the scan chains 5 depicted in FIGS. 1-2 according to an embodiment of the invention. In particular, FIGS. 3A-3C show a circuit structure of scan chain elements that can be placed at certain locations along each scan chain 5, regardless of whether the scan chain is arranged in a row or a column of the grid structure.

Referring now to FIG. 3A, this figure shows a scan chain element 20 that can be used in a scan chain at locations that are between intersections of a scan chain in a column with a scan chain in a row. For example, scan chain element 20 can be used at locations along the scan chains 5 of FIGS. 1-2 where the rows of scan chains do not intersect with the columns of scan chains. As shown in FIG. 3A, scan chain element 20 can include a latch 25 controlled by a clock signal CLK. An example of a latch that can be used in scan chain element 25 includes a flip flop. In FIG. 3A, latch 25 takes the form of a gated D flip flop. A multiplexer 30 provides data to an input of latch 25. In one embodiment, multiplexer 30 can include two selectable inputs and a control input to select between the inputs. The selectable inputs can include a data input (Di) and a scan input (Si), and the control input can include a scan enable input (Scan Enable). Scan chain element 20 also includes a scan output multiplexer 35 coupled to the data output (Q) of latch 25. Scan output multiplexer 35 is configured to shift data from latch 25 in the direction of data flow of the scan chain (i.e., left-to-right direction) to a latch of another scan chain element that follows scan chain element 25. As shown in FIG. 3A, scan output multiplexer 35 has a first selectable input that receives the data output Do from latch 25, a second selectable input that receives a scan data input Si provided to the scan chain element 25, and a control input configured to receive the Scan Enable signal.

In operation, when Scan Enable is at a logic "high" level ("1") and the scan chain in which scan chain element 20 is situated is in a test mode of operation, multiplexer 30 selects scan input $S_i$ for application to the data input of latch 25, while scan output multiplexer 35 selects the data output Q from latch 25, and forwards it as scan output So. Alternatively, when Scan Enable is at a logic "low" level ("0") and the scan chain is in a functional mode of operation, multiplexer 30 selects data input $D_i$ for application to the data input of latch 25. Latch 25 then shifts the data of Q as data output Do. U.S. patent application Ser. No. 14/273,261 entitled "PERFORMANCE SCREEN RING OSCILLATOR FORMED FROM PAIRED SCAN CHAINS" provides further details of a circuit structure that can be used for scan chain element 20 as well as alternative circuit structures.

FIG. 3B shows a scan chain element 40 that can be used in a scan chain at locations where there is an intersection of a scan chain in a column with a scan chain in a row. For example, scan chain element 40 can be used at locations along the scan chains 5 of FIGS. 1-2 where the rows of scan chains intersect with the columns of scan chains. In one embodiment, the circuit structure of scan chain element 40 can be used at all northeast corners in a PSRO loop that is desired to be configured in the two-dimensional grid structure. For example, consider the PSRO loops 15 illustrated in FIG. 2. Each PSRO loop 15 in FIG. 2 includes a northeast corner, which is where the scan chain element 40 can be located. Furthermore, each PSRO loop 15 in FIG. 2 only has one northeast corner. Note that for clarity in illustrating the PSRO loops 15 and the intersections of the rows and columns of scan chains, the northeast corners of each of the PSRO loops would occur about the intersections of rows of scan chains and columns of scan chains. The use of a northeast corner in the two-dimensional grid to place scan chain element 40 is not meant to limit the scope of the various embodiments of the present invention. Those skilled in the art will appreciate that scan chain element 40 can be placed at other directional locations within the two-dimensional grid. For example, all of the PSRO loops can have scan chain element 40 located at other common directional locations such as a southwest corner, a southeast corner, or a northwest corner. In another embodiment, it is also possible to have the PSRO loops with scan chain element 40 located in different corners. Those skilled in the art will appreciate that such a configuration may have some PSROs that do not ring, while other PSROs do ring. The PSROs that ring and the PSROs that do not ring will likely occur in somewhat of a random location. Nevertheless, a PSRO loop going through any odd number of inversions would still ring as long as the loop was of sufficient length.

As shown in FIG. 3B, scan chain element 40, like scan chain element 20 of FIG. 3A, can include a latch 25 controlled by a clock signal CLK. Multiplexer 30 can provide data to an input of latch 25. In this embodiment, the two selectable inputs of multiplexer 30 can include data input Di and a scan input (Si1) representing scan input provided from either the scan chain in the row or the scan chain in the column that intersects with the row at the location of scan chain element 40. The control input Scan Enable is used to select between the data input Di and the scan input Si1.

Scan chain element 40 can also include a scan chain link 45 that can be used to link scan chain element 40 with scan chain elements from other scan chains to form a PSRO loop. As shown in FIG. 3B, scan chain link 45 can include an inverting multiplexer 50. In one embodiment, inverting multiplexer 50 can have a first selectable input that inverts a scan data input Si2 from the scan chain in the row or the intersecting column that does not provide Si1. A second selectable input of inverting multiplexer 50 receives scan data input Si1. A control input of inverting multiplexer 50 is configured to receive a PSRO mode enable signal that initiates oscillation of a formed PSRO.

As shown in FIG. 3B, scan chain link 45 can further include a two-input AND gate 55. AND gate 55 is coupled to inverting multiplexer 50 to provide the control input. A first input of AND gate 55 is configured to receive the PSRO mode enable signal, and a second input of the AND gate is configured to receive scan data output Do from latch 25.

Scan chain element 40, like scan chain element 20, also includes a scan output multiplexer 35 coupled to the data output (Q) of latch 25. Scan output multiplexer 35 is configured to shift data from latch 25 in the direction of data flow of the scan chains at the intersection respectively, to a latch of another scan chain element that follows scan chain element 40 in that corresponding row and column.

In operation, when Scan Enable is at a logic "low" level during one or more test modes of operating the integrated circuit, and PSRO Mode is at a logic "high" level, the output of latch 25 causes non-inverting multiplexer 50 to select scan input Si2, enabling scan chain link 45 to form a portion of a PSRO at this intersection of scan chains that is making a turn in the two-dimensional grid structure. Below are further details on the locations of these turns within the two-dimensional grid structure and how the turns are programmed to configure the PSRO loops.

When Scan Enable is at a logic "high" level ("1") and the scan chains in which scan chain element 20 is situated are in a test mode of operation, multiplexer 30 selects scan input Si1 for application to the data input of latch 25, while scan output multiplexer 35 selects the data output Q from latch 25, and forwards it as scan output So. Alternatively, during a functional mode of operation, when Scan Enable is at a logic "low" level ("0") and PSRO mode is a logic "low" level ("0"), multiplexer 30 selects data input $D_i$ for application to the data input of latch 25. Latch 25 then shifts the data of Q as data output Do to functional logic fed by Do.

FIG. 3C shows a scan chain element 60 that can be used in a scan chain at non-northeast locations where there is an intersection of a scan chain in a column with a scan chain in a row. For example, scan chain element 60 can be used at all corner locations along the scan chains 5 of FIGS. 1-2 where the rows of scan chains intersect with the columns of scan chains, but not at northeast corners. Like scan chain element 40, this directional location is only an example, and is not meant to limit the various embodiment of the present invention. For example, all of the PSRO loops can have scan chain element 60 located at other directional locations (e.g., a southwest corner, southeast corner, etc.), that are different for the one selected for scan chain element 40.

Referring back to FIG. 3C, scan chain element 60, like scan chain element 40 of FIG. 3B, can include a latch 25 controlled by a clock signal CLK. Multiplexer 30 can provide data to an input of latch 25. In this embodiment, the two selectable inputs of multiplexer 30 can include data input Di and a scan input Si1. The control input Scan Enable is used to select between the data input Di and the scan input Si1.

Scan chain element 60 can also include a scan chain link 45 that can be used to link scan chain element 60 with scan chain elements from other scan chains to form a PSRO loop. As shown in FIG. 3C, scan chain link 45 can include a non-inverting multiplexer 65. In one embodiment, non-inverting multiplexer 65 can have a first selectable input that includes scan data input Si2. A second selectable input of non-inverting multiplexer 65 receives a scan data input Si1. A control input of non-inverting multiplexer 65 is provided from the data output Do of latch 25.

Note that FIGS. 3B and 3C show scan chain link 45 as separate components for sake of clarity in illustrating circuit components of scan chain elements at various locations along a scan chain. However, those skilled in the art will appreciate that scan chain link 45 can be implemented in various configurations. For example scan chain link 45 could be configured as one component for adjacent scan chain elements or as a component that is separate from the scan chains and configurable to be implemented as desired to create oscillating PSRO loops of any the scan chains used in test scan circuitry.

Scan chain element 60, like scan chain elements 20 and 40, also includes a scan output multiplexer 35 coupled to the data output (Q) of latch 25. Scan output multiplexer 35 is configured to shift data from latch 25 in the direction of data flow of the scan chains at the intersection, respectively, to a latch of another scan chain element that follows scan chain element 60 in that corresponding row and column.

In operation, when Scan Enable is at a logic "low" level during a test mode of the integrated circuit, and PSRO Mode is at a logic "high" level, the output of latch 25 causes non-inverting multiplexer 65 to select scan input Si2, enabling scan chain link 45 to form a portion of a PSRO at this intersection of scan chains that is making a turn in the two-dimensional grid structure.

When Scan Enable is at a logic "high" level ("1") and the scan chain in which scan chain element 60 is situated is in a test mode of operation, multiplexer 30 selects scan input Si1 for application to the data input of latch 25, while scan output multiplexer 35 selects the data output Q from latch 25, and forwards it as scan output So. Alternatively, during a functional mode of operation, when Scan Enable is at a logic "low" level ("0"), multiplexer 30 selects data input $D_i$ for application to the data input of latch 25. Latch 25 then shifts the data of Q as data output Do to functional logic fed by Do.

Figure 4A:
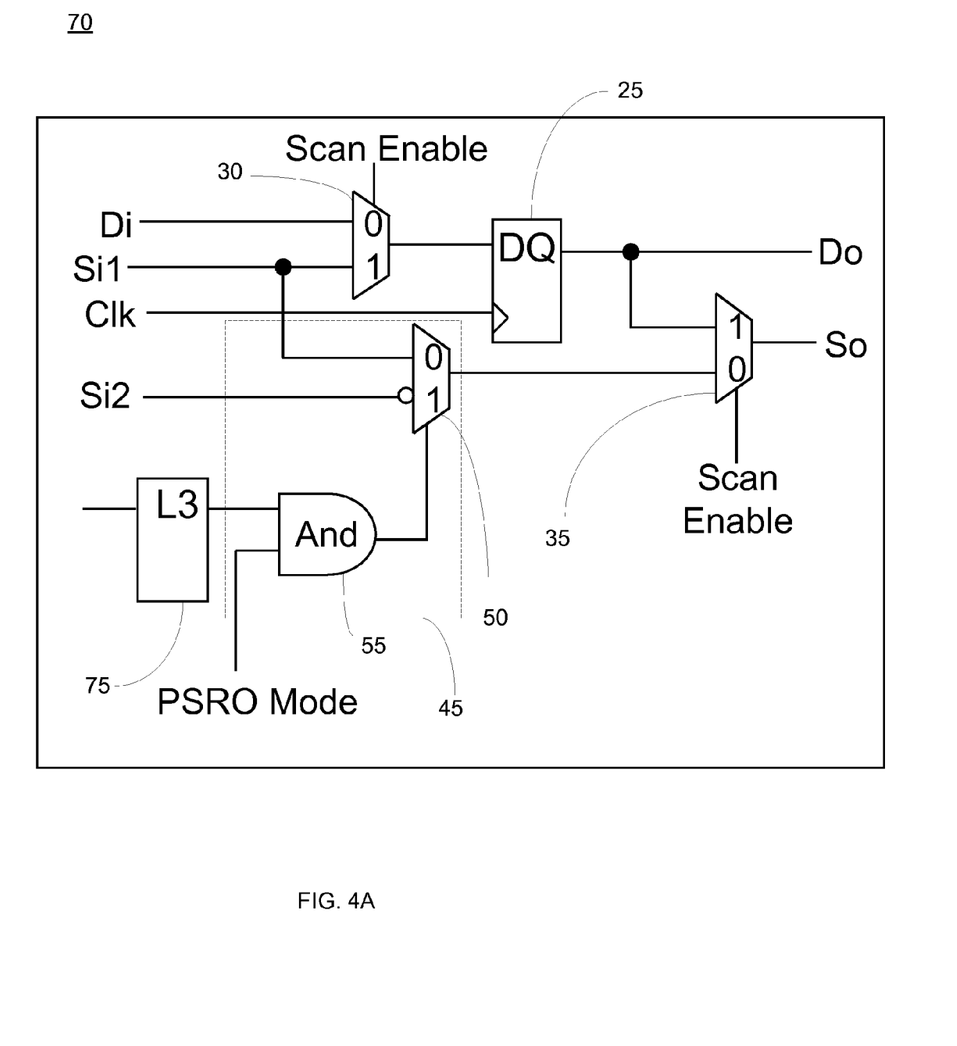
FIGS. 4A-4B are schematic diagrams showing details of scan chain elements that can be used at various locations along the scan chains depicted in FIGS. 1-2 according to an alternative embodiment of the invention.
Figure 4B:
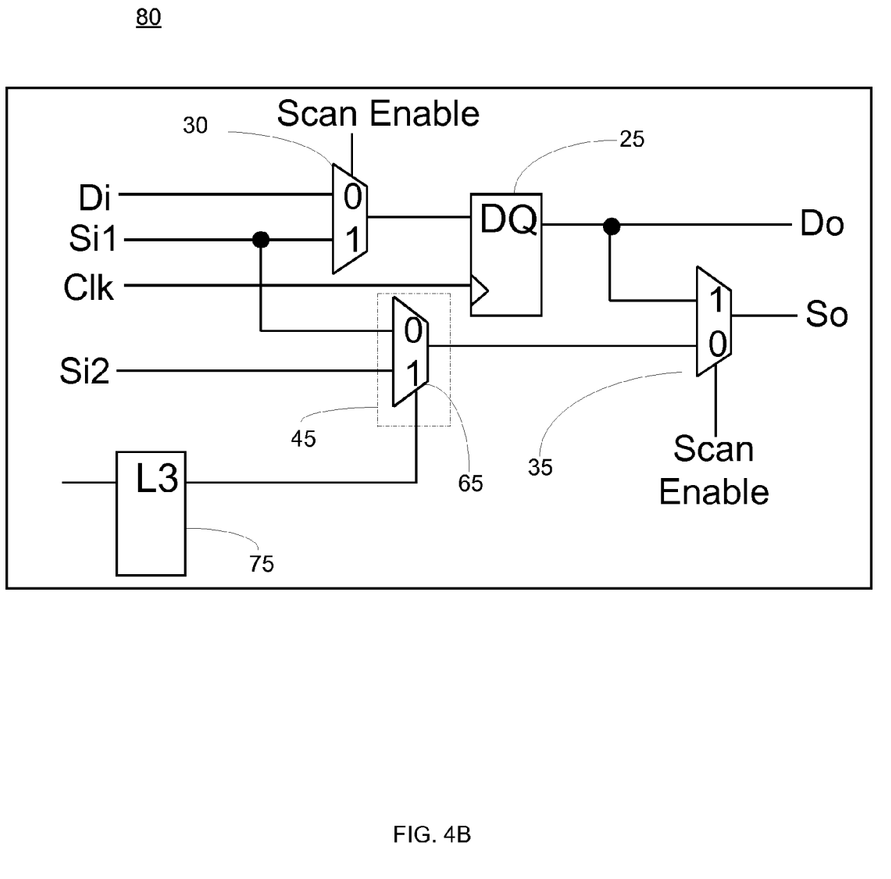

FIGS. 4A-4B are schematic diagrams showing further details of scan chain elements that can be used at various locations along the scan chains depicted in FIG. 1 according to an alternative embodiment of the invention. In particular, FIGS. 4A-4B are alternative circuit structures to those illustrated in FIGS. 3B-3C, respectively, for those locations in which there is an intersection between scan chains. As explained below in more detail, the circuit structures for scan chain elements 70 and 80 of FIGS. 4A-4B, respectively, enable PSRO loops to be formed in a multi-dimensional arrangement of scans during both a test mode of an integrated circuit and a functional mode of operation.

Scan chain elements 70 and 80 differ from the scan chain elements 40 and 60 of FIGS. 3B-3C, respectively, in that the data output Do of latch 25 is not used to provide control of the inverting multiplexer 50 and the non-inverting multiplexer 65, respectively. Instead, the control input for inverting multiplexer 50 and non-inverting multiplexer 65 is a function of the data output generated from another latch 75 that is not in scan chain elements 70 and 80. This other latch 75 is referred herein as a scan chain link control latch since it has a role in providing the controlling input to inverting multiplexer 50 and the non-inverting multiplexer 65 that controls the functioning of scan chain link 45 to form PSRO loops through these various corners where rows and columns in the grid structure intersect. As shown in FIGS. 4A-4B, the control provided by the scan chain link control latch 75 is independent of latch 25. Scan chain link control latch 75 can be a specially designated latch in scan circuitry that can be used by scan chain link 45 to pair certain scan chain elements of a scan chain with scan chain elements in another scan chain to enable formation and oscillation of the PSRO loops. Examples of latches that can be used as the scan chain link control latch 75 can include scan only latches, L3 latches and spare functional latches.

The operation of the embodiment illustrated in FIGS. 4A-4B is similar to FIGS. 3B-3C, respectively, except that the use of the scan chain link control latch 75 enables formation of PSRO loops during one or more test modes of operation and a functional mode of operation. For a functional mode of operation (i.e., Scan Enable is at a logic "low" level), if the PSRO Mode is at a logic "high" level (and the output of the scan chain link control latch is at a logic high level) as provided by scan chain link control latch 75, then inverting multiplexer 50 (FIG. 4A) can select scan input Si2, enabling scan chain link 45 to form a portion of a PSRO at this intersection of scan chains that is making a turn in the two-dimensional grid structure. In this manner, the PSRO loop can be formed and oscillate during the functional mode.

FIG. 5 is a schematic diagram showing further details of scan chain elements 85 at locations where a few scan chains 5 depicted in FIG. 1 intersect. The depiction of FIG. 5 can correspond to any particular area in the two-dimensional grid where six scan chains 5 intersect. Scan chain elements 85 at these intersections can take the form of any of the circuit structures depicted in FIGS. 3B-3C and 4A-4B. The specific circuit structure in these intersections will depend of whether it is desired to have a PSRO loop 15 passing therethrough, and whether the intersection will be the corner in the grid having the common directional location (e.g., northeast corners) where an inverting multiplexer is used for one of the turns of the PSRO loop. For clarity in illustrating aspects of the present invention, FIG. 5 only illustrates the scan chain elements 85 at the intersections of scan chains 5 with the multiplexers (e.g., inverting multiplexer 50 and the non-inverting multiplexer 65) used in conjunction with scan input Si1 and scan input Si2 as illustrated in FIGS. 3B-3C and FIGS. 4A-4B to form PSRO loops. A more detailed view of scan chain elements 85 can include the other components illustrated in the circuit structures of FIGS. 3B-3C and FIGS. 4A-4B.

As shown in FIG. 5, each inverting multiplexer 50 and non-inverting multiplexer 65 can receive input from two scan chains at a particular intersection. In particular, the inverting multiplexers 50 and non-inverting multiplexers 65 in FIG. 5 can select input from a scan chain in either a row or column of the two-dimensional grid. As an example, consider the intersection at the top right corner of the two-dimensional grid of FIG. 5. The inverting multiplexer 50 can receive input from the scan chain 5 of the row that passes through that intersection and input from the scan chain of the column that passes through the intersection that is inverted by multiplexer 50. The non-inverting multiplexer 65 at that intersection can receive input from the scan chain 5 of the row that passes through that intersection and input from the scan chain of the column that passes through the intersection.

In the various embodiments of the present invention, scan values can be scanned to and stored in scan elements 85 in scan chains 5 through standard scanning methods using the CLK and Scan Enable signals to configure PSRO loops. For example, scan chain elements having the circuit structure illustrated in FIGS. 3A-3C and FIGS. 4A-4B can be configured to form PSRO loops by first performing a scan operation to precondition scan chain elements from the scan chains that are desired to form the PSRO loops with values to define the PSRO locations including the predetermined corners in which the inverting multiplexer will be utilized. The scan operation is then turned off. Next, logical "low" (0) values can be applied to the inputs of each scan chain. This flushes data out of any configured PSRO loops to insure correct operation. Once the PSRO loops have been configured, then asserting the PSRO mode to a logical "high" (1) will start the rings oscillating and allow one to observe any configured ring oscillators at the scan ring outputs of the PSRO loops during one or more test modes of operation.

With regard to scan chain elements having the circuit structure illustrated in FIGS. 4A-4B, these elements can be configured to form PSRO loops by first scanning states into the scan chains containing the scan chain link control latches to define the ring oscillators. Next, the Scan Enable signal can then be de-asserted. Setting these elements can also be done using functional logic operations by well-known techniques. Logical "low" (0) values can then be applied to the inputs of each scan chain to flush data out of any configured PSRO loops to insure correct operation. The integrated circuit can then be placed in functional mode, and the PSRO mode can be asserted to allow one to observe the ring oscillators at the scan ring outputs of the PSRO loops during the functional mode of operation in addition to the test mode.

In the example illustrated in FIG. 5, the scan elements 85 of scan chains 5 have been configured to form two PSRO loops 15. Each of the PSRO loops 15 illustrated in FIG. 5 have a turn at a common directional location with respect to the two dimensional grid that is facilitated by an inverting multiplexer 50. In FIG. 5, this turn is located in a northeast corner of the PSRO loops. For ease of illustration, the PSRO loops 15 in FIG. 5 are shown with a circular pattern. This is not meant to limit the various embodiments of the invention. Other shaped-patterns are within the scope of the various embodiments described herein. Whatever pattern is configured for the PSRO loop 15, it will be characterized by having only one turn at a particular directional location that happens to be common with all other PSRO loops 15 in the two-dimensional grid. In the example of FIG. 5, the common directional location of the PSRO loops 15 where there is only one turn and where an inverting multiplexer 50 is situated, is the northeast corner of the loops. As mentioned above, the various embodiments of the invention are not meant to be limited to any particular directional location. For example, all of the PSRO loops can be configured or globally distributed with an inverting multiplexer 50 at other common directional locations (e.g., a southwest corner, southeast corner, etc. It is also possible to have the PSRO loops located in different corners if desired.

Figure 6:
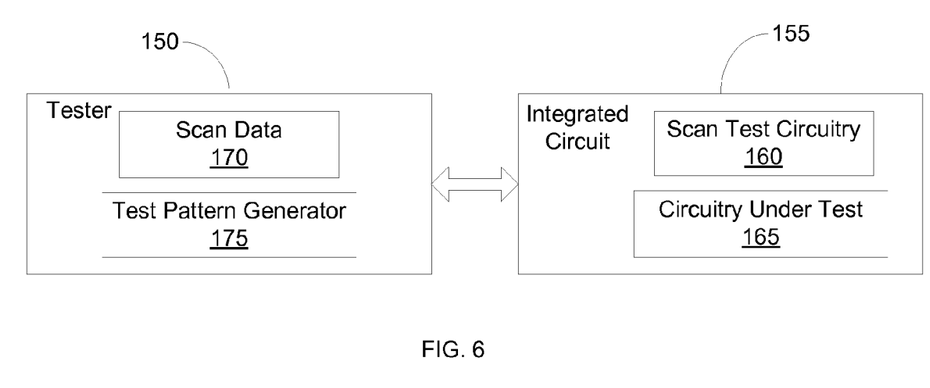
FIG. 6 is a schematic block diagram illustrating an integrated circuit tester in use with an integrated circuit that can have circuit structures depicted in FIGS. 1-5 according to an embodiment of the invention.

FIG. 6 is a schematic block diagram illustrating an integrated circuit tester 150 in use with an integrated circuit 155 that can have circuit structures depicted in FIGS. 1-5 according to an embodiment of the invention. In FIG. 6, tester 150 can be used to test integrated circuit 155 in one of any number of well known approaches. Integrated circuit 155 can include scan test circuitry 160 coupled to additional internal circuitry 165, and that is subject to testing utilizing scan test circuitry that can include any of the circuit structures depicted in FIGS. 1-5. In one embodiment tester 150 can store scan data 170 associated with scan testing of the integrated circuit. Such scan data may correspond to test patterns provided by a test pattern generator 175. In other embodiments, at least a portion of the tester 150, such as the test pattern generator 175, may be incorporated into the integrated circuit 155. In another embodiment, tester 150 may be incorporated into the integrated circuit 155 as in, for example, a built-in self-test (BIST) arrangement.

The tester 150 in the testing system of FIG. 6 need not take any particular form, and various conventional testing system arrangements can be modified in a straightforward manner to support the various circuit structures depicted in FIGS. 1-5. For example, tester 150 can comprise a load board in which an integrated circuit subject to scan testing is installed in a portion of the load board. Tester 150 can also comprise processor and memory elements for executing stored program code. In one embodiment, the processor can implement a test pattern generator 175. Associated scan data 170 can be stored in memory. Those skilled in the art will appreciate that numerous alternative testers may be used to perform scan testing of an integrated circuit using the various circuit structures disclosed herein. For example, as indicated above, in an alternative embodiment, at least portions of the tester 150 may be incorporated into the integrated circuit itself, as in a BIST arrangement.

Figure 7:
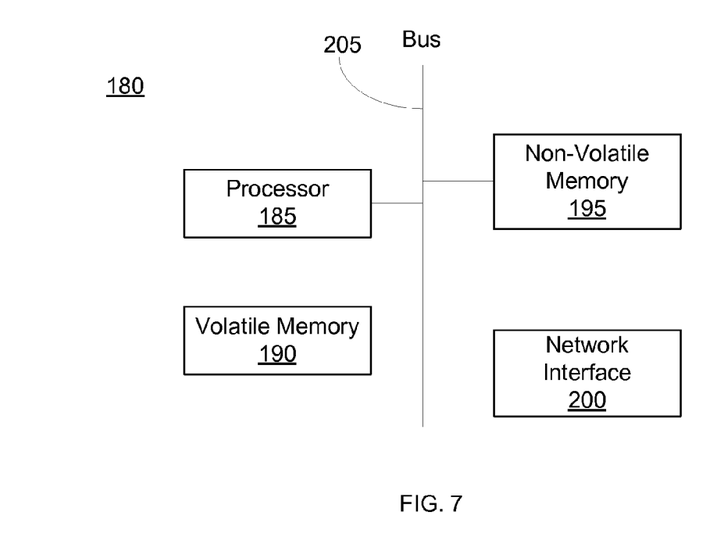
FIG. 7 is a schematic diagram of a computing environment that may be used to generate an integrated circuit design that can have circuit structures depicted in FIGS. 1-5 according to an embodiment of the invention.

The insertion of circuit structures in scan chains like those described for FIGS. 1-5 in scan test circuitry 160 of a given integrated circuit design may be performed in a computing environment 180 of the type shown in FIG. 7. Such a computing environment 180 can comprise a design system configured for use in designing integrated circuits such as integrated circuit 155 to include scan test circuitry 160 having scan chains and the circuit structures described herein that can generate a PSRO from pairing scan chain elements from a multi-dimensional arrangement of scan chains during both a test mode of operation and a functional mode of operation.

Computing environment 180 can comprise a processor 185 coupled to a volatile memory 190 (e.g., RAM), and a non-volatile memory 195 (e.g., ROM). A network interface 200 can be coupled to processor 185, memory 190 and memory 195 via a data bus 205 for permitting communication with other systems and devices over one or more networks. Processor 185 can implement a scan module for supplementing core designs with scan chain elements and circuit structures disclosed herein, in conjunction with integrated circuit design software.

A scan module, core designs, scan chain elements, and integrated circuit design software can be implemented at least in part in the form of software stored in memory 190 and 195 and processed by processor 185. For example, the memory 190 and 195 may store program code that is executed by the processor 185 to implement particular circuit structures described herein within an overall integrated circuit design process. Memory 190 and 195 is an example of what can generally be referred to as a computer program product. The computer program product may include a computer readable storage medium (or media) having computer readable program instructions thereon for causing a processor to carry out aspects of the present invention. The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Java, Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts described herein.

As indicated above, embodiments of the invention may be implemented in the form of integrated circuits. In a given integrated circuit implementation, identical die are typically formed in a repeated pattern on a surface of a semiconductor wafer. Each die includes scan test circuitry as described herein, and may include other structures or circuits like those described with respect to FIGS. 1-5 that enable the creation of PSROs from pairing scan chain elements in a multi-dimensional arrangement of scan chains during both a test mode of operation and a functional mode of operation of an integrated circuit. The individual die are cut or diced from the wafer, then packaged as an integrated circuit. One skilled in the art would know how to dice wafers and package die to produce integrated circuits. Integrated circuits with circuit structures described herein that are so manufactured are considered embodiments of this invention.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A circuit structure, comprising:
    a multi-dimensional arrangement of a plurality of scan chains in an integrated circuit, each of the scan chains having a plurality of interconnected scan chain elements that form a shift register to apply test patterns to inputs of combinational logic in the integrated circuit and read outputs from the combinational logic based on the inputted test patterns; and
    a scan chain link that links selected scan chain elements from the scan chains to form at least one performance screen ring oscillator (PSRO) loop within the multi-dimensional arrangement of the scan chains.

2. The circuit structure according to claim 1, wherein each PSRO loop includes turns that occur at an intersection of one scan chain with another scan chain.

3. The circuit structure according to claim 2, wherein one turn of all the turns in the PSRO loop includes an inverting multiplexer.

4. The circuit structure according to claim 3, wherein the inverting multiplexer is controlled by a latch associated with a scan chain element in one of the scan chains at the intersection.

5. The circuit structure according to claim 3, wherein the inverting multiplexer is controlled by a scan chain link control latch that is independent of any latch associated with a scan chain element in one of the scan chains at the intersection.

6. The circuit structure according to claim 3, wherein the inverting multiplexer in the PSRO loop is situated in the multi-dimensional arrangement of scan chains in a directional location that is common to the directional location of all other inverting multiplexers associated with any other PSRO loops in the multi-dimensional arrangement of scan chains.

7. The circuit structure according to claim 3, wherein all other turns in the PSRO loop include only a non-inverting multiplexer.

8. The circuit structure according to claim 7, wherein each non-inverting multiplexer corresponding with a turn in the PSRO loop is controlled by a latch associated with a scan chain element in one of the scan chains at the intersection that coincides with the turn.

9. The circuit structure according to claim 7, wherein each non-inverting multiplexer corresponding with a turn in the PSRO loop is controlled by a scan chain link control latch that is independent of any latch associated with a scan chain element in one of the scan chains at the intersection that coincides with the turn.

10. The circuit structure according to claim 1, wherein the multi-dimensional arrangement of scan chains includes a two-dimensional grid structure having the scan chains arranged in rows and columns, wherein adjacent scan chains in the rows and columns have a direction of data flow that is opposite from one another.

11. The circuit structure according to claim 10, wherein the PSRO loop forms a pattern in the rows and columns of the two-dimensional grid structure, wherein a flow direction of the PSRO loop follows the direction of data flow of the scan chains in the rows and columns of the two-dimensional grid structure in which the PSRO loop is situated.

12. The circuit structure according to claim 1, wherein the PSRO operates in the integrated circuit only during a test mode of operation.

13. The circuit structure according to claim 1, wherein the PSRO operates in the integrated circuit during both a test mode of operation and a functional mode of operation.

14. The circuit structure according to claim 1, wherein the scan chain link forms the PSRO loop in the multi-dimensional arrangement of scan chains according to a predetermined pairing parameter that is common to the scan chain elements in the scan chains that form the PSRO loop.

15. A circuit structure, comprising:
a two-dimensional grid structure of a plurality of scan chains arranged in rows and columns in an integrated circuit, each of the scan chains having a plurality of interconnected scan chain elements that form a shift register to apply test patterns to inputs of combinational logic in the integrated circuit and read outputs from the combinational logic based on the inputted test patterns, wherein adjacent scan chains in the rows and columns have a direction of data flow that is opposite from one another; and
a scan chain link that links selected scan chain elements from the scan chains to form at least one performance screen ring oscillator (PSRO) loop within the two-dimensional grid structure of scan chains, the PSRO loop forming a pattern in the rows and columns of the two-dimensional grid structure, wherein a flow direction of the PSRO loop follows the direction of data flow of the scan chains in the rows and columns of the two-dimensional grid structure in which the PSRO loop is situated.

16. The circuit structure according to claim 15, wherein each PSRO loop includes turns that occur at an intersection of one scan chain in a row with another scan chain in a column.

17. The circuit structure according to claim 16, wherein one turn of all the turns in the PSRO loop includes an inverting multiplexer, while other turns in the PSRO loop includes only non-inverting multiplexers.

18. The circuit structure according to claim 17, wherein the inverting multiplexer and the non-inverting multiplexers are controlled by one of a latch associated with a scan chain element coinciding with a scan chain in a row or a scan chain in a column that corresponds to the intersection having the inverting multiplexer and the non-inverting multiplexers, and a scan chain link control latch that is independent of any latch associated with a scan chain element in one of the scan chains at the intersection.

19. The circuit structure according to claim 17, wherein the inverting multiplexer in the PSRO loop is situated in the two-dimensional grid structure in a directional location that is common to the directional location of all other inverting multiplexers associated with any other PSRO loops in the two-dimensional grid structure of scan chains.

20. A method, comprising:
configuring a multi-dimensional arrangement of a plurality of scan chains in an integrated circuit, each of the scan chains having a plurality of interconnected scan chain elements that form a shift register to apply test patterns to inputs of combinational logic in the integrated circuit and read outputs from the combinational logic based on the inputted test patterns; and
forming at least one performance screen ring oscillator (PSRO) loop within the multi-dimensional arrangement of the scan chains.

* * * * *